United States Patent [19]
Takahashi et al.

[11] Patent Number: 6,096,092
[45] Date of Patent: Aug. 1, 2000

[54] AUTOMATIC SYNTHESIZING METHOD FOR LOGIC CIRCUITS

[75] Inventors: Miwaka Takahashi, Kyoto; Masahiko Toyonaga, Hyogo; Yoshihiro Seko, Nara, all of Japan

[73] Assignee: Matsushita Electric Industrial Co., Ltd., Osaka, Japan

[21] Appl. No.: 09/055,354

[22] Filed: Apr. 6, 1998

[30] Foreign Application Priority Data

Apr. 7, 1997 [JP] Japan ..................................... 9-087948

[51] Int. Cl.$^7$ ....................................................... G06F 17/50
[52] U.S. Cl. ................................... 716/18; 716/2; 716/7; 716/17
[58] Field of Search .......................... 395/500.02–500.19; 716/1–21

[56] References Cited

U.S. PATENT DOCUMENTS

| | | | |
|---|---|---|---|
| 5,187,668 | 2/1993 | Okude et al. | 716/8 |
| 5,311,443 | 5/1994 | Crain et al. | 716/10 |
| 5,475,607 | 12/1995 | Apte et al. | 716/10 |
| 5,724,251 | 3/1998 | Heavlin | 716/5 |
| 5,737,237 | 4/1998 | Tanaka et al. | 716/9 |

FOREIGN PATENT DOCUMENTS 06196561  7/1994  Japan .

OTHER PUBLICATIONS

PTO 2000–1244 (English Translation of Japanese Document No. 06196561, invented by Hiromasa Kaida, published Jul. 15, 1994, translated by Diplomatic Language Services, Inc., Feb. 2000, pp. 1–15).

Ramachandran et al. ("Combined topological and functionality–based delay estimation using a layout–driven approach for high–level applications", IEEE Transactions on Computer–Aided Design of Integrated Circuits and Systems, vol. 13, No. 12, Dec. 1994.

Hamada et al. ("A wire length estimation technique utilizing neighborhood density equations", IEEE Transactions on Computer–Aided Design of Integrated Circuits and Systems, vol. 15, No. 8, Aug. 1996, pp. 912–922).

Pedram et al. ("Interconnection length estimation for optimized standard cell layouts", 1989 IEEE International Conference on Computer–Aided Design, 1989, ICCAD–89, Digest of Technical Papers, Nov. 5, 1989, pp. 390–393).

Stroobandt et al. ("An Accurate Interconnection Length Estimation for Computer Logic", IEEE, Jan. 1996, pp. 50–55).

Ramachandran et al. ("Combined topological and functionality based delay estimation using at layout–driven approach for high level applications", European Design Automation Conference, 1992, EURO–VHDL '92, EURO–DAC '92, Sep. 7, 1992, pp. 72–78).

Tetelbaum ("Estimation of Layout Parameters of Hierarchical Systems", IEEE, Jan. 1995, pp. 353–357).

Jyu et al. ("Prediction of Interconnect Delay in Logic Synthesis", IEEE, Jan. 1995, pp. 411–415).

*Primary Examiner*—Paul R. Lintz
*Assistant Examiner*—Phallaka Kik
*Attorney, Agent, or Firm*—McDermott, Will & Emery

[57] ABSTRACT

Logic circuits are experimentally automatically synthesized, and a representative line length of each fanout number is estimated on the basis of a net list resulting from the synthesis. The representative line length corresponds to a length of a line positioned at a center when plural lines are aligned in the order of their lengths (namely, a median line length WLmed(fn)). Furthermore, a standard deviation σmed(fn) and a probability coefficient K(fn) of the deviation are calculated with regard to each fanout number on the basis of the net list. Then, a defined line length WL(fn) of each fanout number fn is calculated by using an expression, WL(fn) =WLmed(fn)+K(fn)·σmed(fn). At this point, when there is a demand for design of an LSI having a high operation speed, the probability coefficient K(fn) is set at a small value, and when there is a demand for design of an LSI completed in a short period of time, the probability coefficient K(fn) is set at a large value. Then, by using a virtual wiring model including the defined line length WL(fn), the logic circuits are automatically synthesized, and a net list resulting from the synthesis is used for generating a layout of the logic circuits.

21 Claims, 10 Drawing Sheets

AUTOMATIC SYNTHESIZING METHOD FOR LOGIC CIRCUITS

BACKGROUND OF THE INVENTION

The present invention relates to improvement in an automatic synthesizing method for logic circuits using a computer.

In accordance with recent development of refinement techniques for a semiconductor integrated circuit, a larger scale circuit design has been realized. In a refined circuit, a parasitic resistance R and a parasitic capacitance C of a line connecting circuit elements are relatively increased, so as to largely influence the circuit, and such influence has become more significant than influence of the circuit elements on the circuit.

Under such circumstances, in a conventional automatic synthesizing method for logic circuits, a virtual wiring model is used in automatic synthesis of the logic circuits. In the virtual wiring model, a length of a line is defined with regard to each group of lines having the same number of branches, for example, a group of lines having no branch, a group of lines having two branches, etc. A synthesizing tool calculates, with regard to each defined length, a capacitance, a resistance and an area of the line by multiplying the defined length by a capacitance, a resistance and an area per unit length, respectively. In the conventional synthesizing method, logic circuits are automatically synthesized by using a previously set virtual wiring model, and a mask layout is subsequently generated on the basis of a net list resulting from the automatic synthesis. Thereafter, an actual line length is extracted from the mask layout with regard to each fanout number (number of branches). Predetermined one line length is selected among the line lengths having each fanout number as a representative line length, and the virtual wiring model is modified on the basis of the representative line length. Then, logic circuits are synthesized and a mask layout is generated again by using the modified virtual wiring model, and the resultant layout is verified whether or not it satisfies a desired performance. When it does not, the aforementioned procedures are repeated. This conventional synthesizing method is described in, for example, Design Compiler Family Reference Manual/Using Floorplanners to Improve Wiring Estimation, published by Synopsys.

In the conventional synthesizing method, the mask layout is required to be generated at least once. In contrast, in another conventional automatic synthesizing method for logic circuits, a representative line length of lines having each fanout number is estimated (predicted) with no mask layout generated. This estimation of a representative line length is carried out on the basis of information obtained from a net list of objective circuits, such as numbers of cells and gates in the circuits. Such estimation is disclosed in, for example, Japanese Laid-Open Patent Publication No. 6-196561.

In a currently adopted automatic synthesizing method for logic circuits, it is necessary to design and develop an LSI having a high operation speed, or it is occasionally necessary to complete the development in a short period of time. Therefore, there are a demand for development of an LSI having a high operation speed even by taking a long development time as well as a demand for development of an LSI having a somewhat high operation speed completed in a short period of time.

In any of the aforementioned conventional synthesizing methods, however, one representative line length is defined through selection or estimation, and a virtual wiring model using the defined representative line length is used for the logic synthesis and generation of a layout. Therefore, in response to any of the aforementioned demands, the representative line length is appropriately determined through a guesswork of a designer. It is thus difficult to meet any of the two demands.

SUMMARY OF THE INVENTION

The object of the invention is providing barometers for satisfying any of the aforementioned two demands in defining a line length to be used in a virtual wiring model in an automatically synthesizing method for logic circuits.

In order to overcome the aforementioned problem, not only one representative line length is obtained but also line redundancy is obtained as a short line length in consideration of distribution of the line lengths of plural lines according to this invention. This short line length is varied to be larger or smaller, so as to satisfy any of the aforementioned two demands.

Specifically, the automatically synthesizing method, of this invention, for a large number of logic circuits included in a semiconductor LSI comprises a representative line length extraction processing for selecting a line length of one line among plural lines connecting the logic circuits as a representative line length; a defined line length determination processing for obtaining a short line length as line redundancy in consideration of distribution of line lengths of the plural lines and obtaining a defined line length by adding the short line length to the representative line length; and a logic circuit automatic synthesis processing for automatically synthesizing the logic circuits by using the defined line length.

In one aspect of the invention, the synthesized logic circuits are once laid out, and the distribution of the line lengths is actually obtained on the basis of the actual plural lines obtained from this layout, so as to calculate the short line length as the line redundancy.

In another aspect of the invention, the representative line length and a standard deviation corresponding to the distribution of the plural line lengths are estimated without actually laying out the logic circuits, so that the defined line length can be estimated by adding them.

As a result, according to the automatically synthesizing method of the invention, when a performance of a high speed operation is demanded of the semiconductor LSI, the line redundancy adjusted in consideration of the distribution of the line lengths of the plural lines is set at a small value, namely, the short line length is set to be short.

On the other hand, when the development of the semiconductor LSI is demanded of completing in a short period of time, the line redundancy adjusted in consideration of the distribution of the line lengths of the plural lines is set at a large value, namely, the short line length is set to be long. Accordingly, when the logically synthesized logic circuits are actually laid out, the actual line lengths are shorter than the defined line length, resulting in satisfying the requirement in the operation speed. As a result, there is no need to repeat the logic synthesis and layout, and hence, the desired semiconductor LSI can be obtained in a short period of time.

BRIEF DESCRIPTION OF THE DRAWINGS

Preferred embodiments of the present invention are illustrated in the accompanying drawings in which.

DETAILED DESCRIPTION OF THE INVENTION

Now, preferred embodiments of the invention will be described with reference to the accompanying drawings.

EMBODIMENT 1

Figure 1:
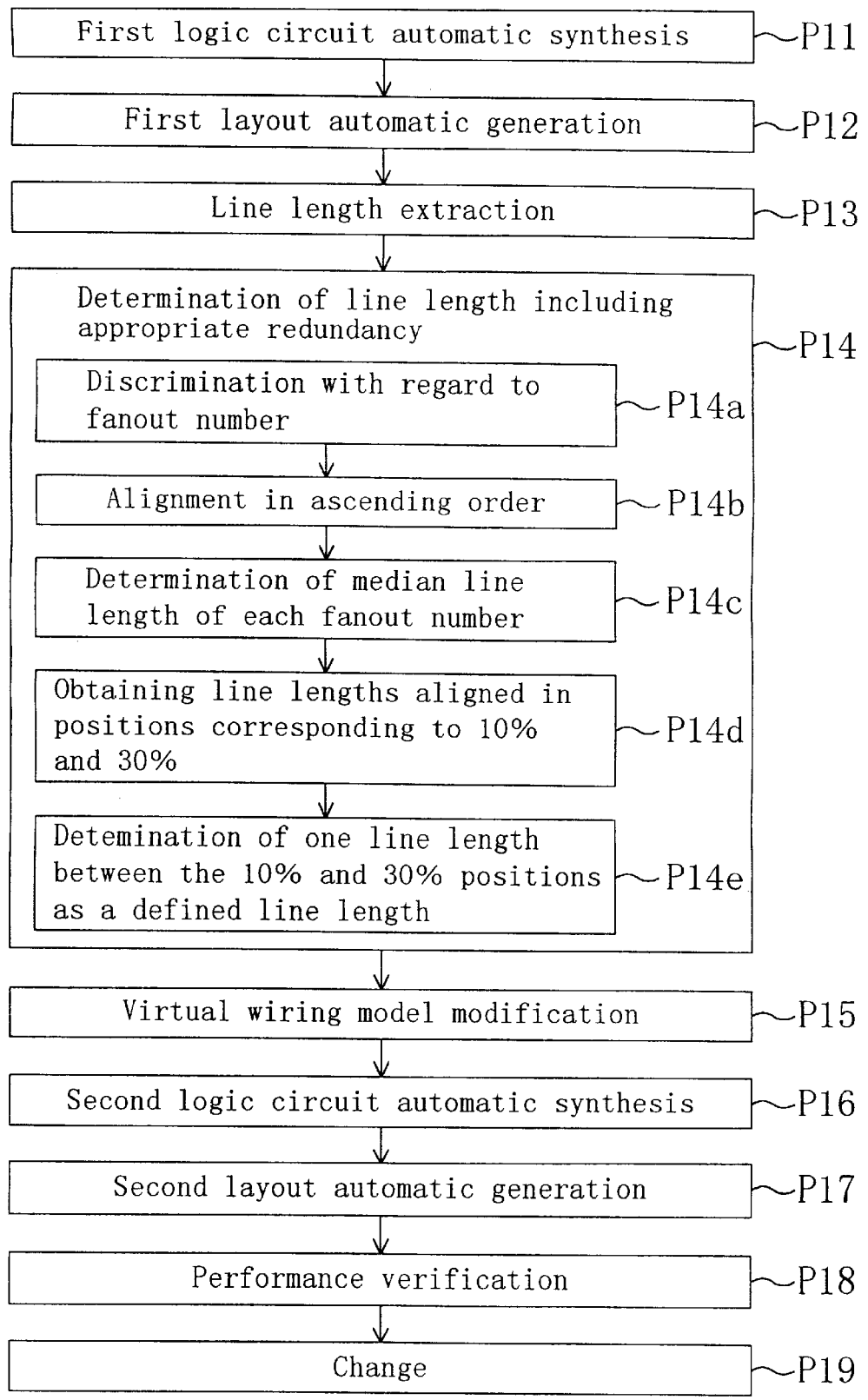
FIG. 1 is a flowchart for showing procedures in an automatic synthesizing method for logic circuits according to a first embodiment of the invention.

FIG. 1 is a flowchart for roughly showing procedures in an automatic synthesizing method for logic circuits according to a first embodiment.

In FIG. 1, a process P11 is a first logic circuit automatic synthesis processing, where hardware description and a macro cell library are input for logic synthesis on the basis of a previously prepared virtual wiring model, and a resultant net list is output. A process P12 is a first layout automatic generation processing, where the net list output in the first logic circuit automatic synthesis processing P11 and the macro cell library are input, thereby automatically generating a layout.

Furthermore, a process P13 is a line length extraction processing, where lengths of lines having each fanout number are extracted on the basis of the layout generated in the layout automatic generation processing P12.

The present invention is characterized by a process P14, where a line length including appropriate redundancy is determined and defined with regard to each fanout number as a line length of each fanout number to be used in the virtual wiring model. In the definition processing P14, a large number of line lengths extracted in the line length extraction processing P13 are first discriminated with regard to the respective fanout numbers in a processing p14a. Next, plural line lengths having the same fanout number are aligned in the ascending order in a processing p14b, and a line length positioned at the center among all the lines aligned in the ascending (or descending) order is selected in a processing p14c (i.e., a representative line length extraction processing). The thus selected line length is used as a representative line length and is assumed as a median of the line lengths of the lines having the corresponding fanout number (hereinafter referred to as the median line length WLmed(fn)). Furthermore, in a processing p14d, line lengths, which are respectively positioned away, in the ascending order (namely, toward the longer lines), from the obtained median line length WLmed by lines in number corresponding to 10% and 30% of the lines, are obtained with regard to each fanout number fn. In a processing p14e (i.e., a defined line length determination processing), one line length is selected from a range between the thus selected two line lengths, so that a difference between this line length and the median line length WLmed(fn) can be obtained as a short line length as line redundancy. A value obtained by adding the short line length to the median line length WLmed(fn), namely, the selected one line length, is determined as a defined line length WL(fn).

A process P15 is a modification processing for the virtual wiring model, where the virtual wiring model is modified by using the defined line length WL(fn) determined with regard to each fanout number fn. A process P16 is a second logic circuit automatic synthesis processing, where the hardware description and the macro cell library are input, and the virtual wiring model modified in the virtual wiring model modification processing P15 is used for the logic synthesis and a resultant net list is output in the same manner as in the first logic circuit automatic synthesis processing P11.

A process P17 is a second layout automatic generation processing, where the net list output in the second logic circuit automatic synthesis processing P16 and the macro cell library are input, thereby automatically generating a layout.

A process P18 is a performance verification processing, where the performance attained by the layout generated in the second layout automatic generation processing P17 is verified. When a desired operation speed is attained, the design proceeds to a subsequent step. A process P19 is a change processing. When it is judged, in the performance verification processing P18, that the performance of the generated layout cannot attain the desired operation speed, namely, signal transmission delay time exceeds a predetermined time, a cell in question is, for example, replaced with another cell having a higher driving ability, so as to generate a circuit having the desired performance.

Figure 2:
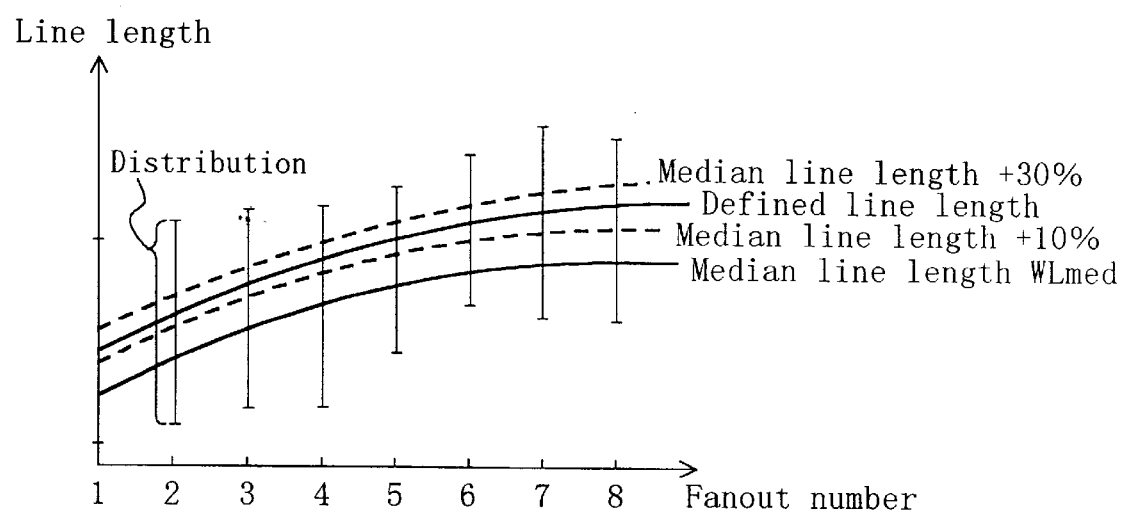
FIG. 2 is a diagram for showing distribution of line lengths, a median line length and a defined line length with regard to respective fanout numbers in the first embodiment.

FIG. 2 shows distribution of line lengths and an example of the defined line length with regard to each fanout number In FIG. 2, the abscissa indicates a fanout number and the ordinate indicates a line length. FIG. 2 shows a distribution range of the line lengths having each fanout number extracted in the line length extraction processing P13, a median line length of each fanout number, a range of line lengths included between positions corresponding to 10% and 30% in the ascending order away from the median line length, and a defined line length determined in the range between the positions corresponding to 10% and 30%.

Accordingly, in this embodiment, when the defined line length obtained in the aforementioned manner is used for the automatic synthesis of the logic circuits in the second logic circuit automatic synthesis processing P16, most of the lines are estimated to have larger lengths than their actual lengths depending upon the defined line length. Therefore, the logic circuits can include cells having driving abilities suitable to their larger lengths. As a result, when the thus generated layout is verified, the performance of the logic circuit obtained in the second logic circuit automatic synthesis processing P16 is occasionally satisfactory.

Next, the effect of this embodiment will be described. A table below shows the performance of the net list generated in the second logic circuit automatic synthesis processing P16 and the performance of a layout generated on the basis of the net list generated both in the case where the defined line length is determined as a line length positioned away from the median line length by the number corresponding to 30% (A) and in the case where the defined line length is determined as a line length positioned away from the median line length by the number corresponding to 10% (B).

|  | Performance of Net List | Performance of Layout | |
|---|---|---|---|
|  | Delay (nS) | Delay redundancy (nS) | Area |
| (A) Median + 30% | 15.0 | +1.75 | 1.13 |
| (B) Median + 10% | 12.0 | −0.36 | 1.10 |

This table shows the performance of the net list generated by using the virtual wiring model modified in the virtual wiring model modification processing P15 and the performance of the layout obtained through actual wiring by the second layout automatic generation processing P17. Also, the delay redundancy shown as the performance of the layout corresponds to redundancy with regard to the performance of the net list. Actually, in the layout performance of the case (A), the delay redundancy is 1.75 ns with regard to the net list performance of 15.0 ns, namely, the redundancy is 13.25 ns. In the layout performance of the case (B), the delay redundancy is −0.36 ns with regard to the net list performance of 12.0 ns, namely, the redundancy is 12.36 ns. Comparing the cases (A) and (B) in this table, the delay redundancy is larger and the area is larger in the case (A) and the delay redundancy is smaller and the area is smaller in the case (B). In this manner, when the defined line length of the case (A) is used, there is no need to correct the delay, and hence, time required for the design can be shortened. On the other hand, when the defined line length of the case (B) is used, it is necessary to slightly correct the delay but a logic circuit with a high operation speed can be designed.

Accordingly, in consideration of the distribution of the plural lines having the same fanout number around the median line length WLmed(fn), when the line length in the position corresponding to 30% away from the median line length WLmed(fn) is used as the defined line length WL, the time required for the design can be shortened. When the line length in the position corresponding to 10% away from the median line length WLmed(fn) is used as the defined line length WL, a semiconductor LSI having a high operation speed can be designed.

EMBODIMENT 2

Figure 3:
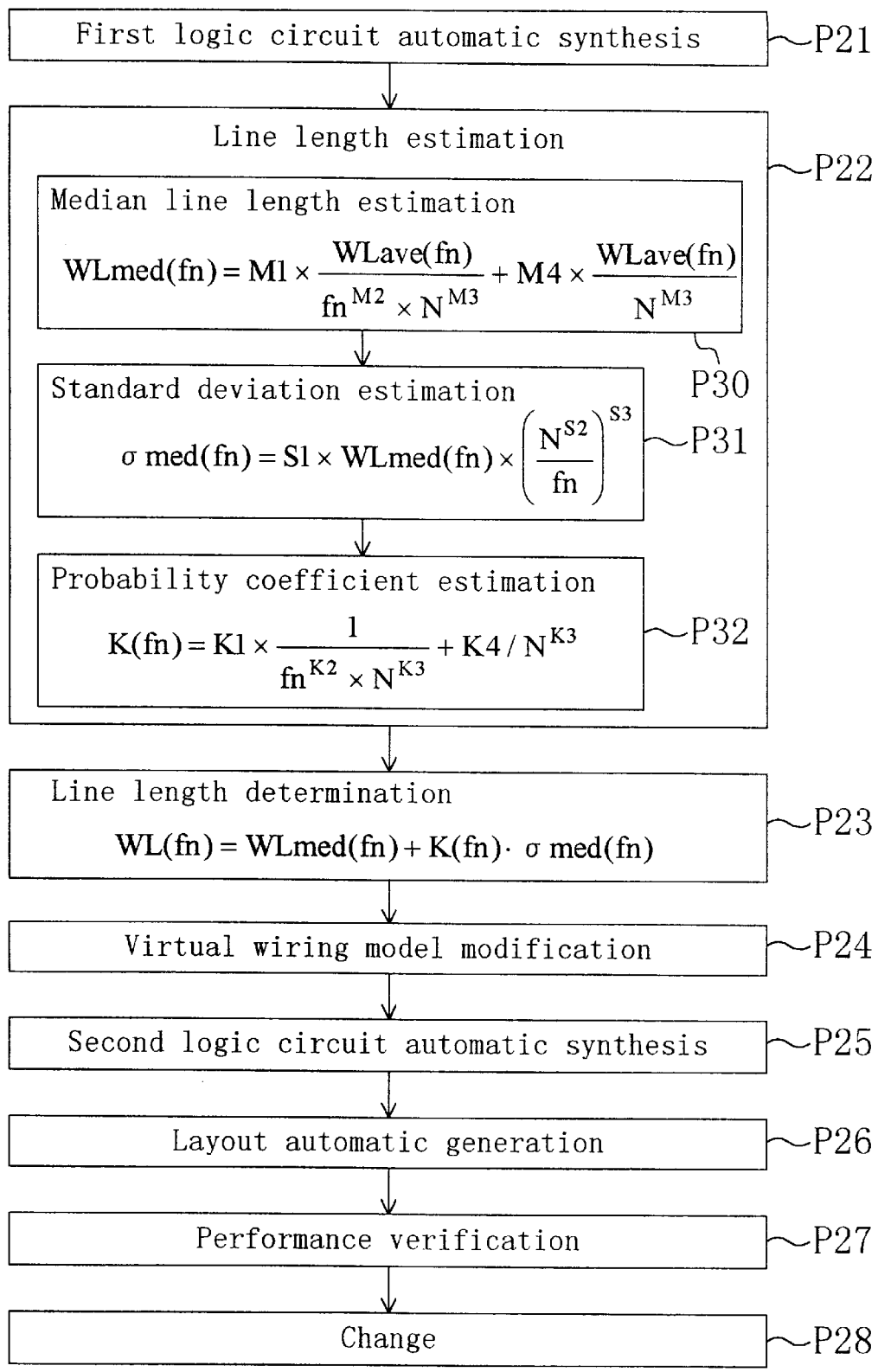
FIG. 3 is a flowchart for showing procedures in an automatic synthesizing method for logic circuits according to a second embodiment of the invention.

FIG. 3 is a flowchart for roughly showing procedures in an automatic synthesizing method for logic circuits according to a second embodiment of the invention.

In FIG. 3, a process P21 is a first logic circuit automatic synthesis processing, where hardware description and macro cell library are input for logic synthesis on the basis of a previously prepared virtual wiring model, and a resultant net list corresponding to connection information of the circuits is output. A process P22 is a line length estimation processing, and includes processes P30, P31 and P32 for respectively estimating, on the basis of the net list output in the first logic circuit automatic synthesis processing P21 and the macro cell library input in the first logic circuit automatic synthesis processing P21, a median line length WLmed(fn), a standard deviation σmed(fn) and a probability coefficient K(fn) of lines having each fun-out number fn.

A process P23 is a line length definition processing (defined line length determination processing), where the median line length WLmed(fn), the standard deviation σmed (fn) and the probability coefficient K(fn) of the lines having each fun-out number fn estimated in the line length estimation processing P22 are used, so as to define amline length WL(fn) including appropriate redundancy with regard to each fanout number fn. A process P24 is a virtual wiring model modification processing, where the virtual wiring model is modified by using the defined line length WL(fn) defined in the line length definition processing P23. A process P25 is a second logic circuit automatic synthesis processing, where the modified virtual wiring model is used for the logic synthesis, and a resultant net list corresponding to the connection information of the circuits is output.

Furthermore, a process P26 is a layout automatic generation processing, where the net list output in the second logic circuit automatic synthesis processing P25 and the macro cell library are input, thereby automatically generating a layout. A process P27 is a performance verification processing, where the performance of the layout generated in the layout automatic generation processing P26 is verified, and when a desired operation speed is attained by the layout, the design proceeds to a subsequent step. A process P28 is a change processing. When it is judged that the performance of the obtained layout does not satisfy the desired operation speed in the performance verification processing P27, a cell in question is, for example, replaced with another cell having a higher driving ability, so as to generate a circuit attaining the desired performance.

Next, the line length estimation processing P22 will be described in detail.

As is shown in FIG. 3, the median line length WLmed(fn) of each fanout number fn is estimated as a representative line length in the median line length estimation processing (representative line length extraction processing) P30. In this estimation, calculation is executed by using the following expression 1 on the basis of a fanout number fn, an average line length WLave and a number N of nets of the circuits to be logically synthesized:

$$\text{WLmed(fn)} = M1 * \text{WLave(fn)} / (fn^{M2} * N^{M3}) + M4 * \text{WLave(fn)} / N^{M3} \quad \text{Expression 1}$$

wherein WLmed(fn) indicates a median line length of lines having the same fanout number fn, WLave(fn) indicates an average line length of the lines having the same fanout number fn, and M1, M2, M3 and M4 indicate constants. When a line having a very different length is included in the sample lines, this median line length WLmed(fn) is advantageously scarcely affected by such a line.

Furthermore, in the standard deviation estimation processing P31, a standard deviation a of the lines is obtained on the basis of the median line length WLmed(fn) estimated in the median line length estimation processing P30, the fanout number fn and the number N of nets of the circuits. This processing is carried out by using the following expression 2:

$$\sigma med(fn) = S1*WLmed(fn)*(N^{S2}/fn)^{S3} \quad \text{Expression 2}$$

wherein σmed(fn) indicates a standard deviation of lines having the same fanout number fn, and S1, S2 and S3 indicate constants.

Also, a coefficient K of the standard deviation of the lines (hereinafter referred to as the probability coefficient) is obtained on the basis of the fanout number fn and the number N of nets of the circuits by using the following expression 3:

$$K(fn) = K1*1/(fn^{K2}*N^{K3}) + K4/N^{K3} \quad \text{Expression 3}$$

wherein K(fn) indicates a probability coefficient of lines having the same fanout number fn, and K1, K2, K3 and K4 indicate constants.

The respective constants used in the expressions 1, 2 and 3 can be obtained by using plural circuits, for example, as those listed in the following table:

| Name of circuit | Number of nets | Number of cells |
| --- | --- | --- |
| Circuit 1 | 207 | 170 |
| Circuit 2 | 448 | 412 |
| Circuit 3 | 441 | 423 |
| Circuit 4 | 749 | 731 |
| Circuit 5 | 1673 | 1244 |
| Circuit 6 | 1446 | 1261 |
| Circuit 7 | 1741 | 1648 |
| Circuit 8 | 2215 | 1849 |
| Circuit 9 | 2707 | 2445 |
| Circuit 10 | 2984 | 2752 |
| Circuit 11 | 3012 | 2786 |
| Circuit 12 | 3192 | 2842 |
| Circuit 13 | 3202 | 2887 |
| Circuit 14 | 3440 | 2949 |
| Circuit 15 | 2994 | 2958 |
| Circuit 16 | 5696 | 5473 |
| Circuit 17 | 5845 | 5825 |
| Circuit 18 | 8400 | 7696 |
| Circuit 19 | 8447 | 7746 |
| Circuit 20 | 22129 | 19416 |

Figure 4:
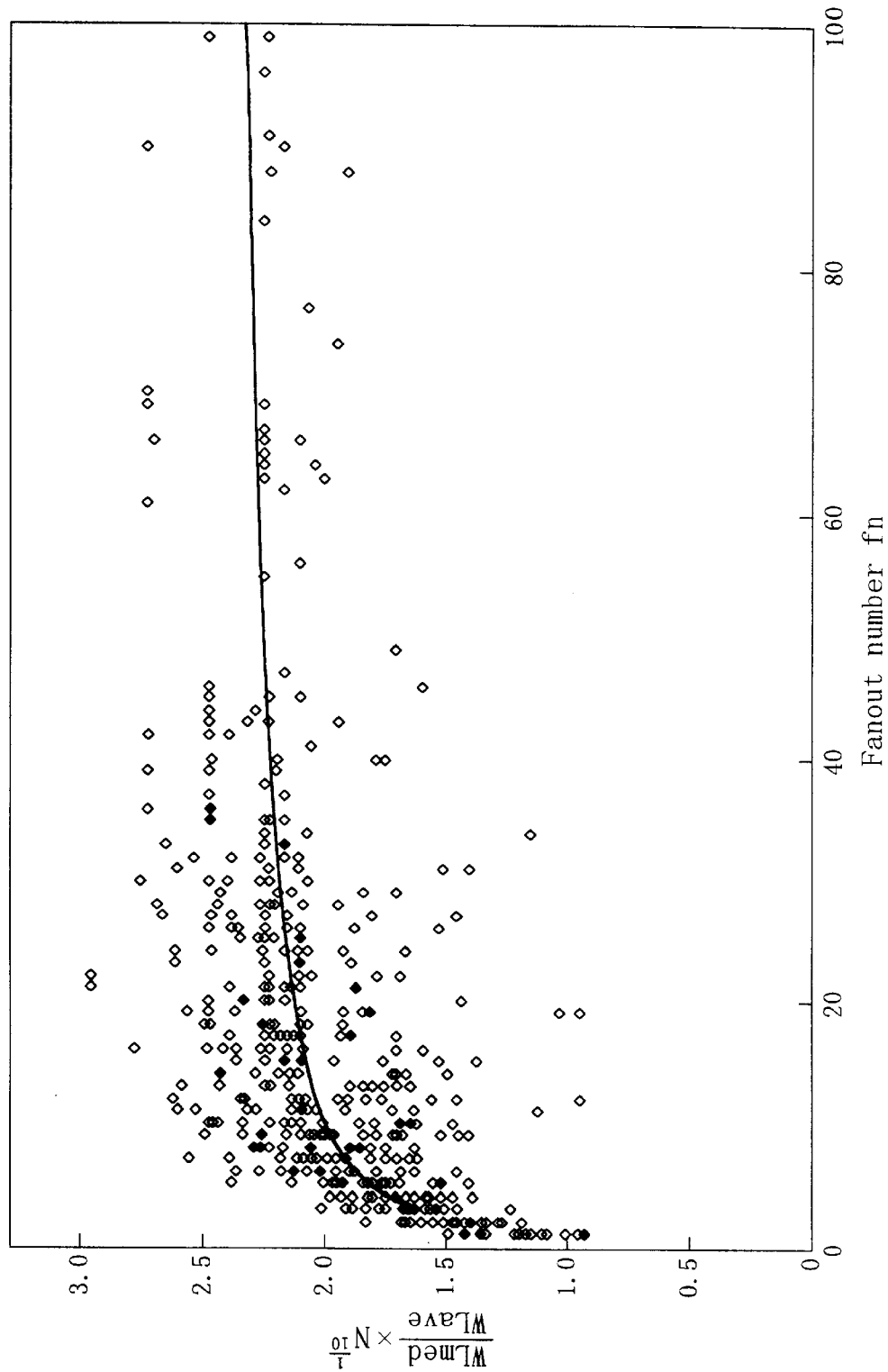
FIG. 4 is a diagram for showing median line lengths actually measured in plural circuits for determining constants in an estimation expression for obtaining a median line length in the second embodiment.

FIG. 4 shows median line lengths WLmed obtained from layouts of the circuits listed in the above table. In FIG. 4, the abscissa indicates a fanout number fn and the ordinate indicates a value of $(WLmed/WLave)*N^{1/0}$. On the basis of this diagram, a graph for showing the expression 1 is drawn with a solid line, and the constants M1 through M4 of the expression 1 are calculated on the basis of this graph. Thus, the following expression is obtained:

$$WLmed(fn) = -1.37*WLave(fn)/(fn^{0.41}*N^{0.10}) + 2.52*WLave(fn)/N^{0.10}$$

Figure 5:
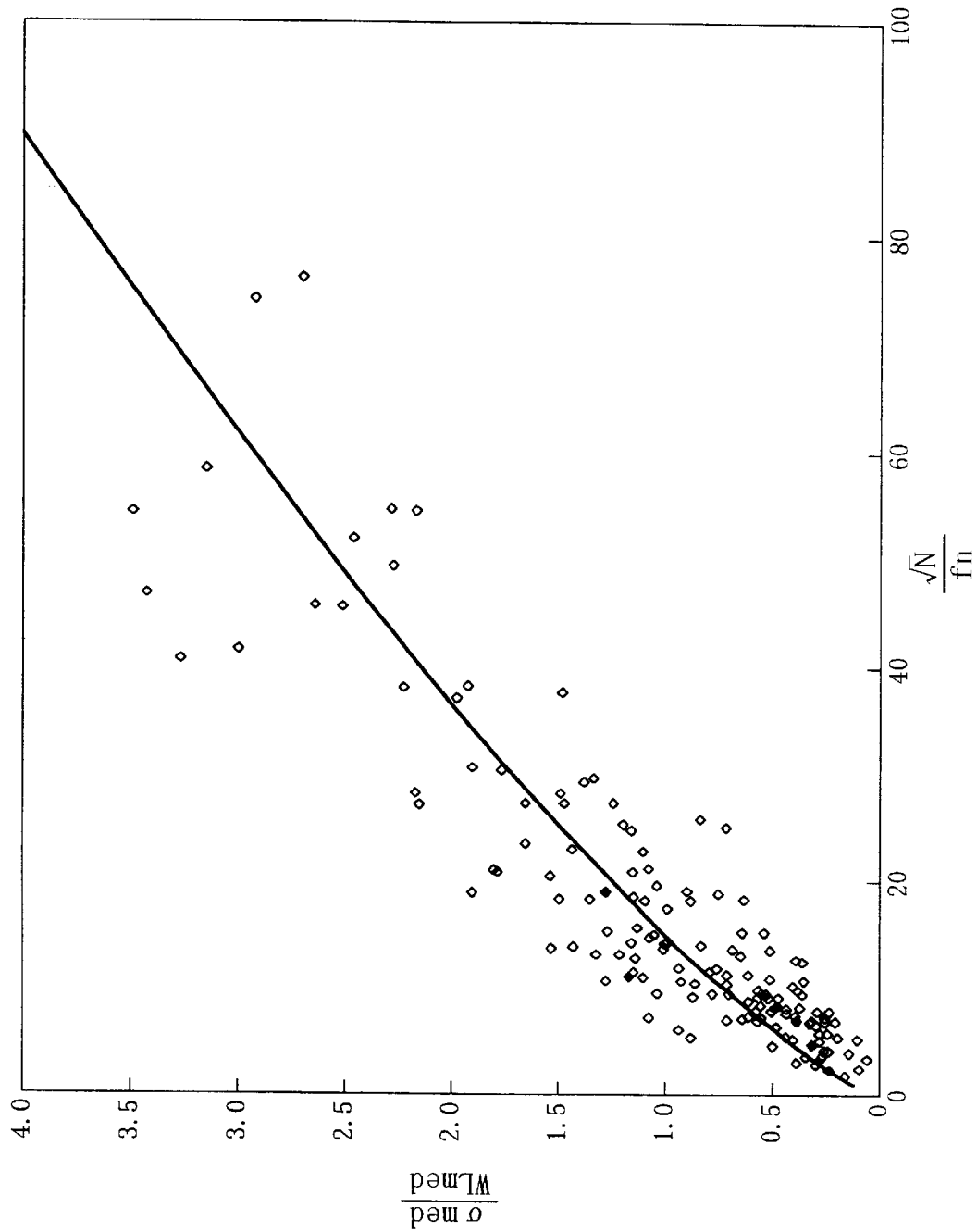
FIG. 5 is a diagram for showing median line lengths actually measured in plural circuits for determining constants in an estimation expression for obtaining a standard deviation of lines in the second embodiment.

FIG. 5 shows standard deviations σmed obtained from the layouts of the circuits listed in the above table. In FIG. 5, the abscissa indicates a value of $(\sqrt{N})/fn$ and the ordinate indicates a value of σmed/WLmed. On the basis of this diagram, a graph for showing the expression 2 is drawn with a solid line, and the constants S1 through S3 of the expression 2 are calculated on the basis of this graph. Thus, the following expression is obtained:

$$\sigma med(fn) = 0.12*WLmed(fn) + (N^{0.50}/fn)^{0.77}$$

Figure 6:
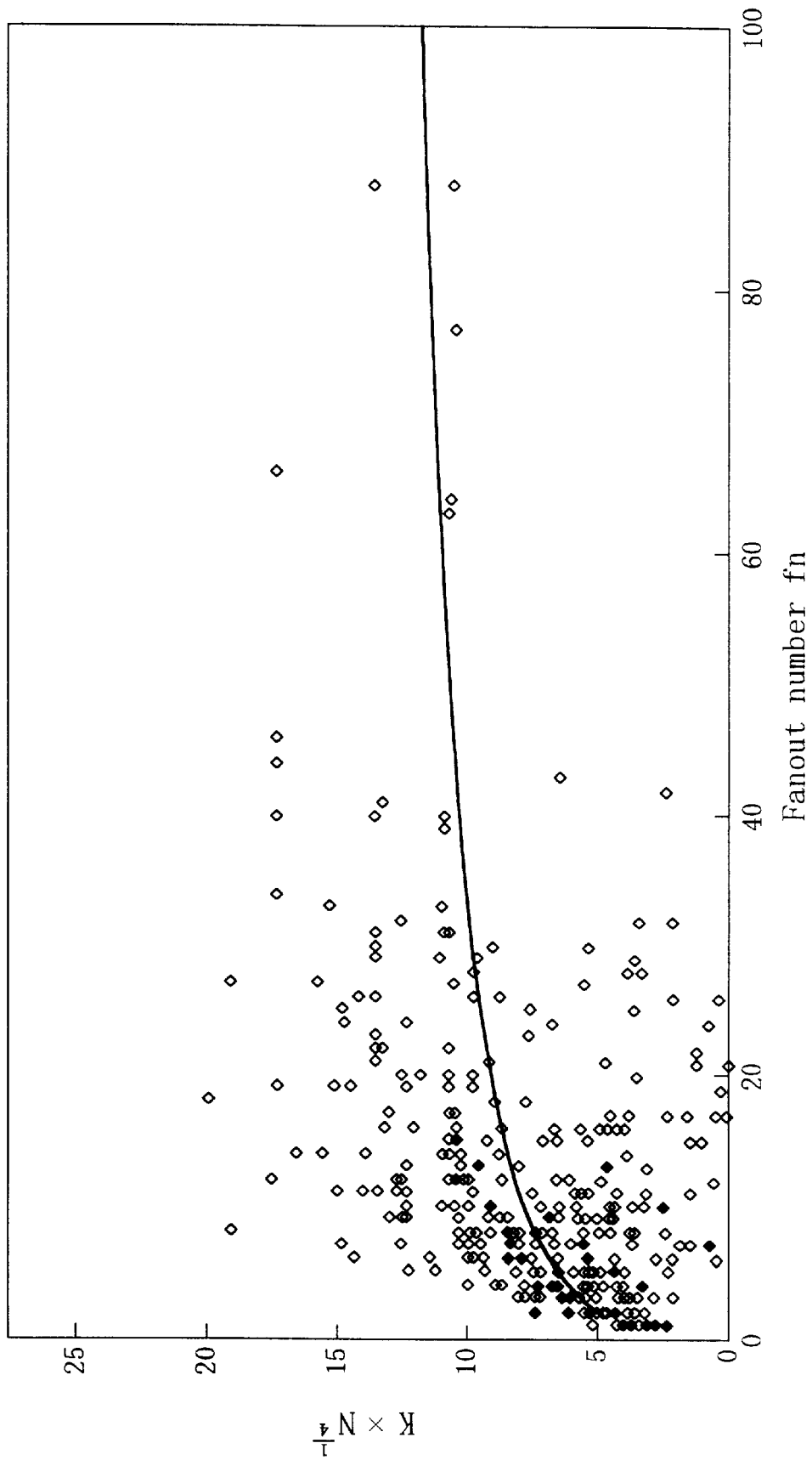
FIG. 6 is a diagram for showing median line lengths actually measured in plural circuits for determining constants in an estimation expression for obtaining a probability coefficient in the second embodiment.

FIG. 6 shows probability coefficients K obtained from the layouts of the circuits listed in the above table. In FIG. 6, the abscissa indicates a fanout number fn and the ordinate indicates a value of $K*N^{1/4}$. On the basis of this diagram, a graph for showing the expression 3 is drawn with a solid line, and the constants K1 through K4 of the expression 3 are calculated on the basis of this graph. Thus, the following expression is obtained:

$$K(fn)*N^{0.25} = -31.34/fn^{0.01}*34.61$$

Next, the line length definition processing (defined line length determination processing) P23 will be described in detail. In the definition processing P23, in order to make redundancy of a line length adjustable in each circuit to be designed, a line length WL including redundancy adjusted in view of estimation accuracy is defined on the basis of the estimated median line length WLmed(fn), the probability coefficient K and the standard deviation σmed(fn) obtained in the line length estimation processing P22 with regard to each fanout number by using the following expression 4:

$$WL(fn) = WLmed(fn) + K(fn) \cdot \sigma med(fn) \quad \text{Expression 4}$$

Figure 7:
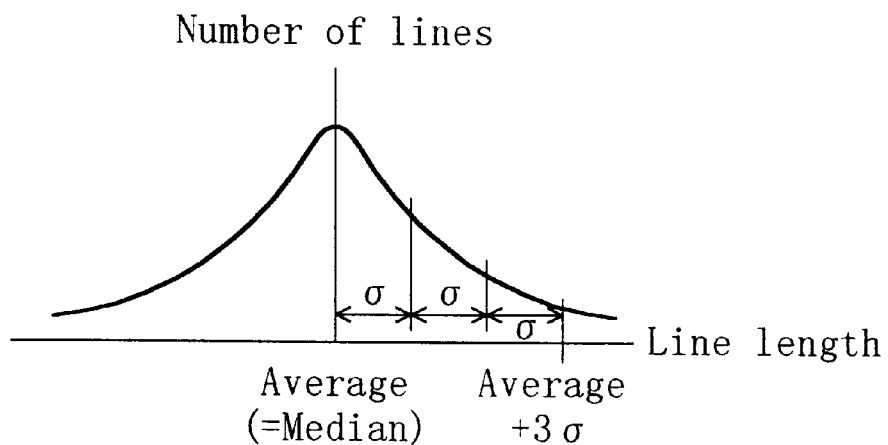
FIG. 7 is a diagram for illustrating a general normal distribution.

At this point, the median line length WLmed(fn) is used for determining the defined line length WL(fn) for the following reason: In the case where the distribution of lines of each fanout number fn is a normal distribution as is shown in FIG. 7, an average line length WLave(fn) is estimated, and the defined line length WL(fn) can be defined on the basis of the average line length WLave(fn) and the standard deviation σave(fn) by using the following expression:

$$WL(fn) = WLave(fn) + K(fn) \cdot \sigma ave(fn) \quad \text{Expression 5}$$

$$WLave(fn) = C \cdot \sqrt{\{St \cdot \Sigma (fn+1)\}}$$

$$\sigma ave(fn) = A \cdot WLave(fn) \cdot \sqrt{(\sqrt{N}/fn)} + B$$

wherein A, B and C indicate constants, St indicates an average area of a logic macro cell connected with a line whose length is to be obtained, and N indicates a number of all nets in the circuit.

For example, in the normal distribution of lines, when the standard deviation σave(fn) is assumed to be 1·σave(fn), 84% of the entire lines are shorter than the defined line length WL(fn). When the standard deviation σave(fn) is assumed to be 2·σave(fn), 98% of the entire lines are shorter than the defined line length WL(fn), and when it is assumed to be 3·σave(fn), 99% of the entire lines are shorter than the defined line length WL(fn).

Figure 8:
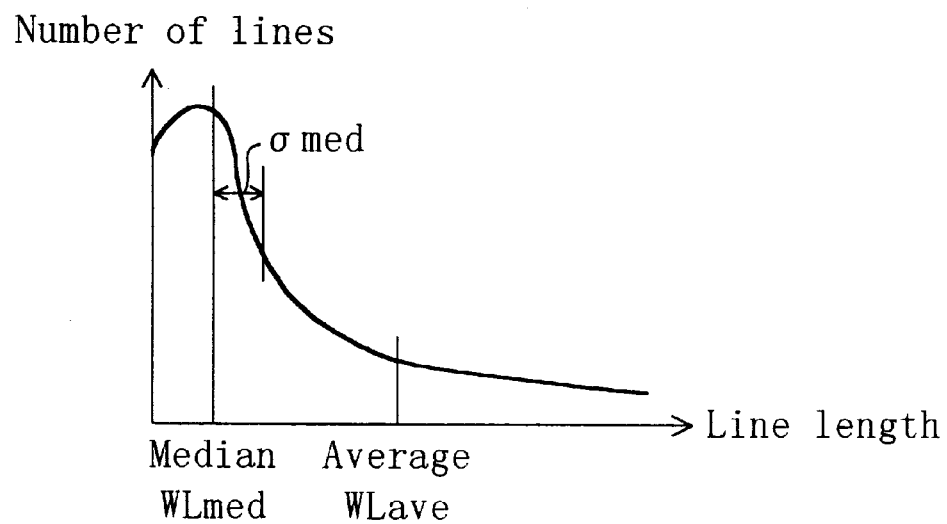
FIG. 8 is a diagram for illustrating a distribution characteristic of line lengths.

However, in the actual layout for an LSI, the distribution of lines is not the normal distribution but has a characteristic as is shown in FIG. 8. Therefore, although the average line length WLave accords with the median line length WLmed in the normal distribution, the average line length WLave does not accord with the median line length WLmed in the distribution characteristic of FIG. 8. This disaccord is more remarkable when the fanout number fn is smaller. When the fanout number fn is smaller, the average line length WLave (fn) becomes further larger than the median line length WLmed(fn). Accordingly, when the average line length WLave(fn) is used as a standard, for an optimistic estimation of the defined line length WL(fn), it is necessary to subtract redundancy K(fn)·σave(fn) from the average line length WLave(fn) as is shown in the following expression, in contrast with the case where an addition is required for a pessimistic estimation of the defined line length WL(fn):

$$WL(fn) = WLave(fn) - K(fn) \cdot \sigma ave(fn)$$

Accordingly, in this embodiment, as a limit value for the optimistic estimation, the median line length WLmed(fn) is used. In this embodiment, the average line length WLave(fn)

included in the expression 1 can be estimated on the basis of the expression 5 or another known expression.

Figure 9A:
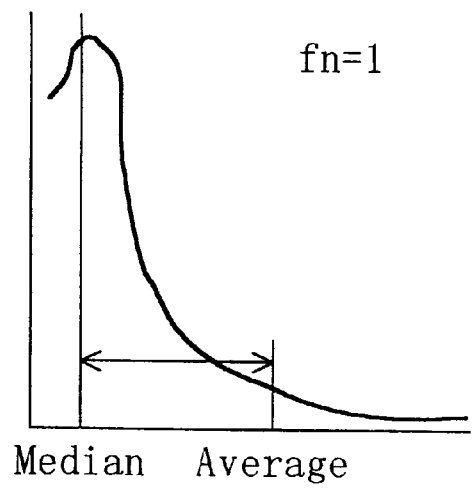
FIG. 9(a) is a diagram for illustrating a distribution characteristic of line lengths having a fanout number fn of 1.
Figure 9B:
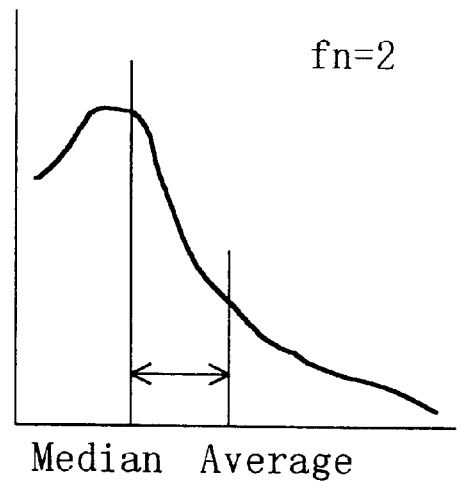
FIG. 9(b) is a diagram for illustrating a distribution characteristic of line lengths having a fanout number fn of 2.
Figure 9C:
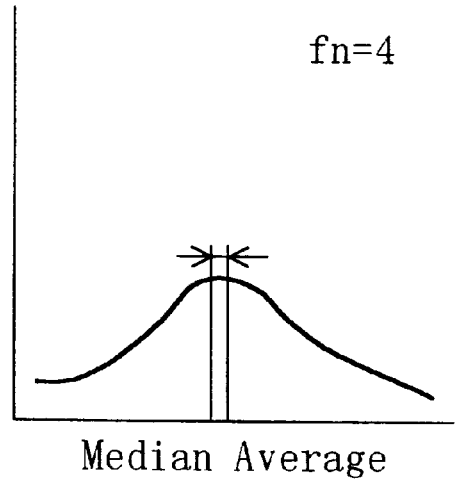
FIG. 9(c) is a diagram for illustrating a distribution characteristic of line lengths having a fanout number fn of 3.

Next, derivation procedures for the expression 1 will be described. As is shown in FIGS. 9(a), 9(b) and 9(c), the median line length WLmed and the average line length WLave approach to each other as the fanout number fn increases. The following table lists median line lengths WLmed and average line lengths WLave actually obtained in an actual circuit having a number N of nets of 22,129.

| Fanout number | Median | Average | Median/Average (%) |
|---|---|---|---|
| 1 | 40.30 | 100.75 | 0.4 |
| 4 | 199.20 | 324.76 | 0.6 |
| 16 | 1287.70 | 1259.91 | 1.02 |

Figure 10:
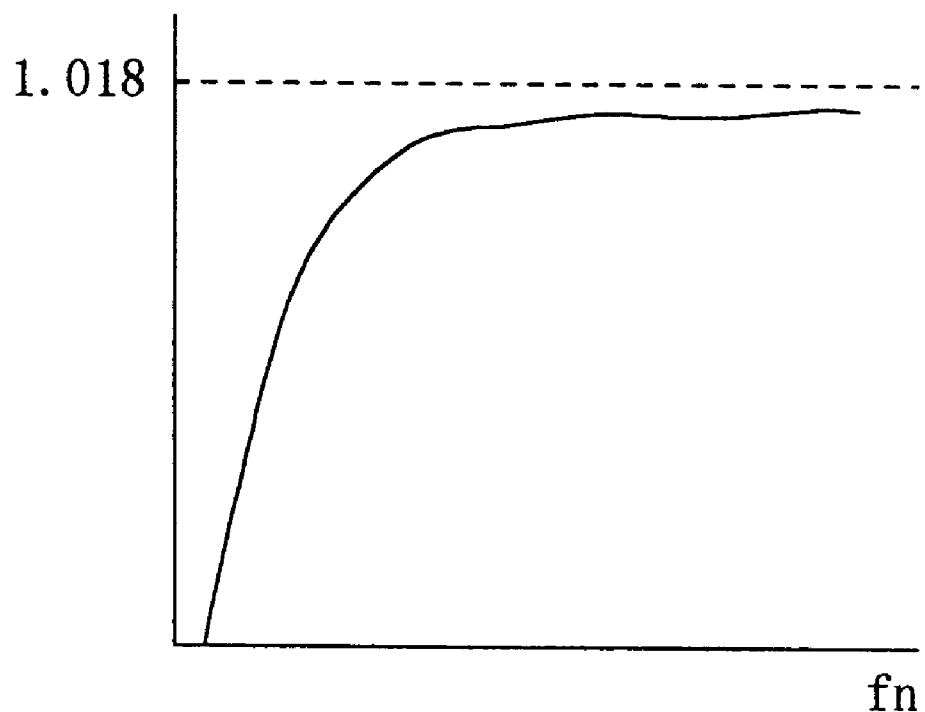
FIG. 10 is a diagram for showing a proportion characteristic of a median line length and an average line length against a fanout number.

As is obvious from this table, when the fanout number fn increases, both the median line length WLmed and the average line length WLave are elongated and the proportion therebetween approaches "1". At this point, a function which approaches a value "1" as the increase of the fanout number fn as is shown in FIG. 10 is defined as the expression 1. In the expression 1, M4 approaches 0.018 (=2.52/$N^{0.1}$) as the fanout number fn increases. However, since the value of $N^{0.1}$ is approximately 2.5 in a normal scale of the number N of nets, the expression 1 is a function approaching "1"as the increase of the fanout number fn.

Next, derivation procedures for the expression 2 will be described. Since the median line length WLmed is elongated together with the average line length WLave as the fanout number fn increases, a relationship between the median line length WLmed and the standard deviation a can be represented by using the fanout number fn as follows:

WLmed(fn+1)=WLmed(fn)+Δ(Δ>0)

σ/WLmed(fn+1)=σ/(WLmed(fn)+Δ)<Δ/WLmed(fn)

σ/WLmed(fn+1)<σ/WLmed(fn)

On the basis of these expressions, the following expression can be derived:

σ/WLmed(fn+1) (1/fn)$^\alpha$

Also, since the number N of nets is increased in proportion to the increase of the area of the circuit, the expression 2 can be derived.

Furthermore, the expression 3 is obtained on the basis of FIG. 6 resulting from experiments similarly to the median line length WLmed(fn). The probability coefficient K(fn) obtained by this expression 3 is defined so that 80% of the entire lines can be smaller than the defined line length WL when it is substituted in the expression 4.

In this embodiment, in the case where an LSI having a high operation speed is required to be designed even by taking a long time for the design, the distribution σmed(fn) of each fanout number fn is set at a small value. As a result, the defined line length WL is optimistically estimated, namely, estimated to be shorter. Therefore, when the logic synthesis is conducted by using a virtual wiring model using the thus defined line length WL, a net list of an LSI having a high operation speed can be obtained. In this case, in the actual mask layout generated in the layout generation processing P24, a large number of lines have larger lengths than the defined line length WL, and there is a possibility that a path not satisfying a design specification for regulating an operation speed (line delay) is included. However, when re-layout design or logic synthesis is carried out on such a path alone, so that a cell connected with such a path is replaced with a cell having a higher driving ability, the speed specification can be satisfied, although it takes time.

On the other hand, in the case where an LSI having a somewhat high operation speed is required to be designed in a short period of time in contrast, the distribution σmed(fn) of each fanout number fn is set at a large value. As a result, the defined line length WL is pessimistically estimated, namely, estimated to be longer. Therefore, when the logic synthesis is conducted by using a virtual wiring model using the thus defined line length WL, in the actual mask layout generated in the layout generation processing P24, a large number of lines have smaller lengths than the defined line length WL, resulting in satisfying the speed (line delay) specification. When the distribution σmed(fn) is set at a further larger value, all the lines satisfy the speed specification, and hence, there is no need of re-layout or logic synthesis. In this case, the resultant LSI is rather inferior in its operation speed owing to the larger line lengths.

Figure 11:
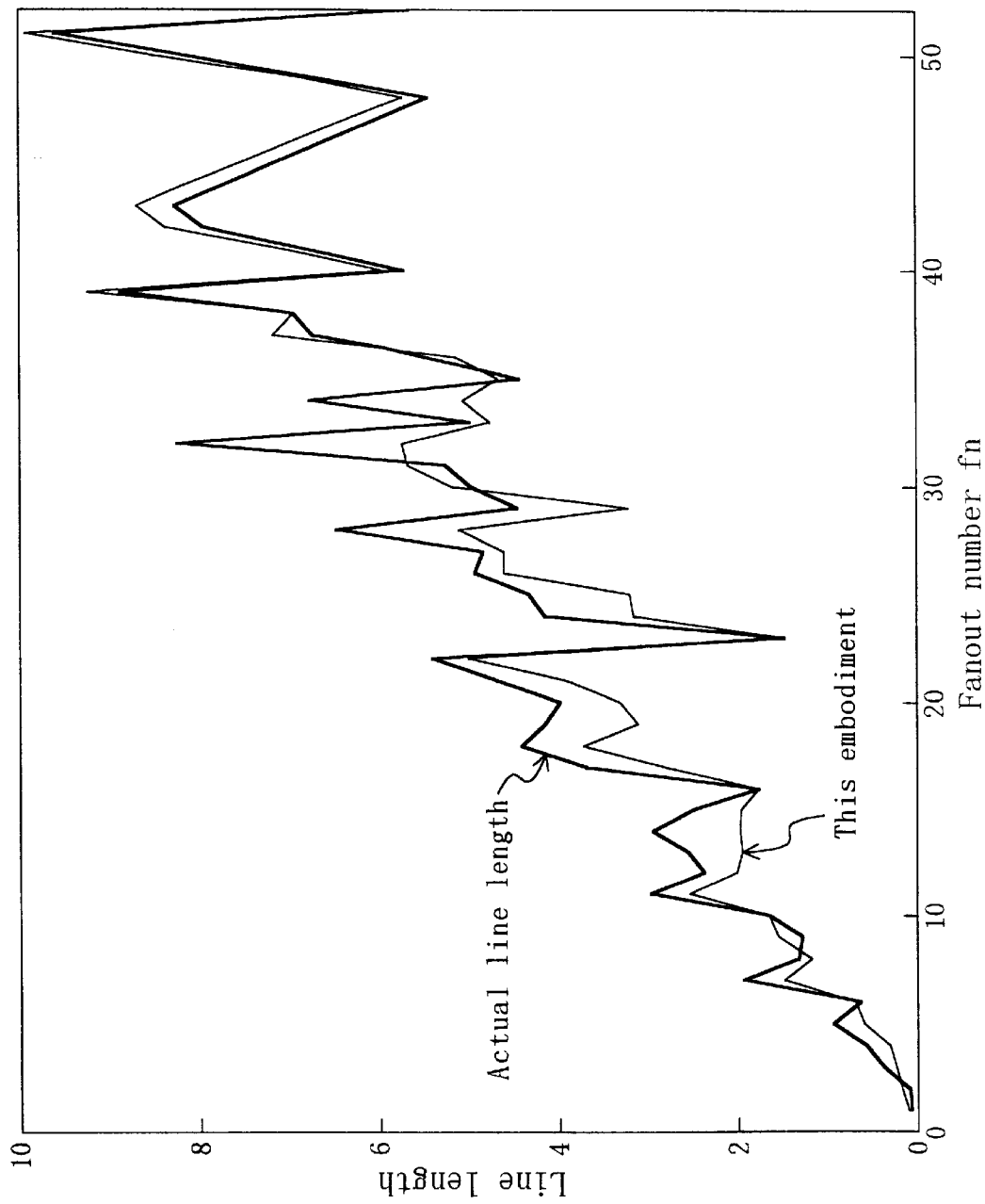
FIG. 11 is a diagram for showing estimation accuracy for a line length attained by the second embodiment.

Estimation accuracy of this embodiment in estimating a line length by using the expression 4 was examined as follows: A logic circuit E used in this examination had 20772 nets and 19260 cells. The result of the examination is shown in FIG. 11. In FIG. 11, actual line lengths of lines covering to 80% of all actual lines having the same fanout number in the circuit E are shown with a thick solid line, and line lengths estimated by the estimation expression (i.e., the expression 4) of this embodiment are shown with a solid line. When an error between the actual line length and the estimated line length was calculated on the basis of FIG. 11, the error was ±24.5%, which reveals that the estimation of this embodiment has sufficiently high accuracy.

What is claimed is:

1. An automatically synthesizing method for a large number of logic circuits included in a semiconductor LSI comprising:

a representative line length extraction processing for selecting a line length of one line among plural lines connecting said logic circuits as a representative line length;

a defined line length determination processing for obtaining a short line length as line redundancy in consideration of distribution of line lengths of said plural lines, and obtaining a defined line length by adding said short line length to said representative line length; and a logic circuit automatic synthesis processing for automatically synthesizing said logic circuits by using said defined line length.

2. The automatically synthesizing method of claim 1, wherein, in said logic circuit automatically synthesis processing, a net list corresponding to connections between said synthesized logic circuits is output, and said automatically synthesizing method is further provided with a layout automatically generation processing for inputting said net list and a macro cell library and generating a layout of said synthesized logic circuits.

3. The automatically synthesizing method of claim 1, wherein said representative line length is selected with regard to each fanout number in said representative line length extraction processing.

4. The automatically synthesizing method of claim 1 or 3, wherein said representative line length is selected on the basis of plural lines obtained through actual layout of said synthesized logic circuits in said representative line length extraction processing.

5. The automatically synthesizing method of claim 4, wherein said plural lines obtained through the actual layout of said synthesized logic circuits are aligned in the order of lengths thereof and a median line length corresponding to a line length of a line positioned at a center is selected as said representative line length in said representative line length extraction processing.

6. The automatically synthesizing method of claim 5, wherein, among said plural lines actually experimentally laid out, one line included in a predetermined range between said median line length and a larger line length is selected, and a difference between a length of said selected one line and said median line length is defined as said short line length as the line redundancy in said defined line length determination processing.

7. The automatically synthesizing method of claim 1 or 3, wherein said representative line length is estimated by using an expression without actually experimentally laying out said logic circuits in said representative line length extraction processing.

8. The automatically synthesizing method of claim 7, wherein said expression used in said representative line length extraction processing includes information obtainable from a net list obtained by previously automatically synthesizing said logic circuits.

9. The automatically synthesizing method of claim 8, wherein said information obtainable from said net list includes a total number of nets and fanout numbers.

10. The automatically synthesizing method of claim 7, wherein said representative line length estimated by using said expression in said representative line length extraction processing corresponds to a median line length that is a length of a line positioned at a center when said plural lines are aligned in the order of lengths thereof.

11. The automatically synthesizing method of claim 10, wherein said expression used in said representative line length extraction processing includes an average line length of said plural lines.

12. The automatically synthesizing method of claim 11, wherein said expression used in said representative line length extraction processing is:

$$WLmed(fn)=M1*WLave(fn)/(fn^{M2}*N^{M3})+M4*WLave(fn)/N^{M3}$$

wherein fn indicates a fanout number, WLmed(fn) indicates a median line length of each fanout number, WLave(fn) indicates an average line length of each fanout number, N indicates a total number of nets, and M1 through M4 indicate constants.

13. The automatically synthesizing method of claim 1 or 3, wherein said short line length as the line redundancy used in said representative line length extraction processing is obtained by multiplying a standard deviation of said lines and a probability coefficient of said standard deviation.

14. The automatically synthesizing method of claim 13, wherein said standard deviation of said lines is calculated based on a median line length obtained by arranging a plurality of lines provided in an actual layout in order of length and selecting one of said plurality of lines which is positioned in the middle of said arrangement of said plurality of lines.

15. The automatically synthesizing method of claim 14, wherein said standard deviation is obtained by the following expression:

$$\sigma med(fn)=S1*WLmed(fn)*(N^{S2}/fn)^{S3}$$

wherein fn indicates a fanout number, $\sigma med(fn)$ indicates a standard deviation of each fanout number, WLmed(fn) indicates a median line length of each fanout number, N indicates a total number of nets, and S1 through S3 indicate constants.

16. The automatically synthesizing method of claim 13, wherein said probability coefficient is calculated on the basis of a fanout number and a total number of nets.

17. The automatically synthesizing method of claim 16, wherein said probability coefficient is obtained by the following expression:

$$K(fn)=K1*1/(fn^{K2}*N^{K3})+K4/N^{K3}$$

wherein fn indicates a fanout number, K(fn) indicates a probability coefficient of each fanout number, N indicates a total number of nets, and K1 through K4 indicate constants.

18. The automatically synthesizing method of claim 1 or 3, wherein said defined line length is obtained by the following expression in said defined line length determination processing:

$$WL(fn)=WLmed(fn)+K(fn)\cdot\sigma med(fn)$$

wherein fn indicates a fanout number, WL(fn) indicates a defined line length of each fanout number, WLmed (fn) indicates a median line length of each fanout number, K(fn) indicates a probability coefficient of each fanout number, and $\sigma med(fn)$ indicates a standard deviation of each fanout number.

19. The automatically synthesizing method of claim 13, wherein said probability coefficient is varied in accordance with a requirement in design of said semiconductor LSI.

20. The automatically synthesizing method of claim 19, wherein said probability coefficient is varied to a smaller value when there is a requirement in the design of said semiconductor LSI for attaining a high operation speed.

21. The automatically synthesizing method of claim 19, wherein said probability coefficient is varied to a larger value when there is a requirement in the design of said semiconductor LSI for completing the design in a short period of time.

* * * * *